Sept. 6, 1966 P. WHITE 3,271,180

PHOTOLYTIC PROCESSES FOR FABRICATING THIN FILM PATTERNS

Filed June 19, 1962 3 Sheets-Sheet 1

INVENTOR
PETER WHITE

BY [signature]
ATTORNEY

PHOTOLYTIC PROCESSES FOR FABRICATING THIN FILM PATTERNS

United States Patent Office 3,271,180

Patented Sept. 6, 1966

3,271,180

PHOTOLYTIC PROCESSES FOR FABRICATING THIN FILM PATTERNS

Peter White, Shenorock, N.Y., assignor to International Business Machines Corporation, New York, N.Y., a corporation of New York Filed June 19, 1962, Ser. No. 205,821
13 Claims. (Cl. 117—38)

This invention relates to a method of fabricating electrical circuits and more specifically to a method and apparatus for fabricating thin film electrical circuits of the microminiature type, and is a continuation-in-part of application Serial No. 112,638, filed on May 25, 1961, now abandoned, and assigned to the same assignee as this invention.

With the development of extremely complex and large scale electrical systems as exemplified, by way of example, by present day general purpose digital computers; the volume occupied by and the power dissipated in such systems have increased enormously. To reduce the magnitude of each of these items, developments have recently been directed to the design of solid state circuitry and to methods of fabricating such circuits. Examples of materials useful in solid state circuitry include semiconductors, magnetics, superconductors, and ferroelectrics. Further, components fabricated of each of these materials have been reduced both as to volume and power dissipation through the application of thin film technology.

Generally, thin films of selected materials are preferably fabricated by means of the thermal evaporation of each material onto a substrate within an evacuated chamber, selected pattern masks being employed as required to define the deposited geometry of each material. This vacuum deposition technique has advantageously been employed to fabricate, in quantity, a large variety of solid state circuits.

Still more recently a further advance in minimum volume combined with low power loss has evolved through what has become generally known as microminiaturization, that is, the reduction in the dimensions of components and interconnection lines within a circuit assembly until these dimensions are equal to or less than one thousandth of an inch. Although it is still desirable to fabricate these microminiature circuits by the technique of vacuum deposition, several problems have arisen. By way of example, since portions of the circuitry may have a width measured in terms of one or more thousandths of Angstrom units, it has been difficult to fabricate the necessary precision pattern masks with apertures of this width to define the deposited geometry and of sufficient rigidity to properly register the deposit upon the substrate. Again, if a proper mask is obtained, a further problem results during the deposition operation due to the fact that a portion of the evaporated material adheres to the mask and alters the dimensions of the apertures therein and in fact may result in the closure of a portion or all of one or more apertures. Finally, it should be noted that when vacuum evaporation techniques are employed, it is difficult to simultaneously fabricate solid state circuitry upon a large area substrate with a high degree of reliability. This is a result of the well known shadowing effect which causes both uneven thickness distribution of the material upon the large area substrate and, further, causes distortion to occur in the deposited configuration due to the angular direction of the evaporation molecules arriving at a mask of finite thickness.

What has been discovered is a novel method of forming thin film circuits, as well as thin film microminiature circuits, which may be practiced in an ambient medium, i.e., an inert atmosphere or a vacuum, without the necessity of employing a pattern mask to intercept portions of the material. In accordance with one aspect of this invention, the method comprises forming an adsorbed layer of an organic vapor capable of being photolytically reacted on a substrate and irradiating so as to react selected portions of said adsorbed layer in required geometric pattern by, for example, a source of light of predetermined wavelenth. Note should be made of the fact that since a directed beam of light is operable to form the required geometric configuration upon the substrate, it is not necessary that the light mask have a surface configuration which corresponds exactly to the contour of the substrate in order to attain precise registration. Rather convex, concave, or other particular shaped light masks are employable in combination with a planar substrate depending, of course, upon the optical system employed. By the method of the invention in the various embodiments to be hereinafter described in detail, various layers of conductors, resistive elements and insulators can be selectively deposited either in an inert atmosphere at atmospheric pressure or within an evacuated chamber upon a substrate to form the required thin film circuit.

It is an object of the invention to provide an improved method of fabricating thin film circuits.

Another object of the invention is to provide a method of fabricating microminiature thin film circuits upon a substrate within an evacuated chamber wherein no pattern mask is positioned within the chamber to define the circuit geometry.

Still another object of the invention is to provide an improved method of fabricating thin films of material having a predetermined geometry.

A further object of the invention is to provide a method of forming microminiature thin film circuits upon a substrate by selectively directing light at a predetermined wavelength onto the substrate in a pattern determined by the circuit geometry in the presence of a vapor capable of being decomposed through a photolytic reaction.

Yet another object of the invention is to provide a method of fabricating microminiature thin film circuits in a predetermined geometric pattern wherein a pattern defining mask includes apertures dimensioned to a scale other than the scale of the predetermined pattern.

A still further object of the invention is to provide a method of employing light to determine the geometry of deposited thin film conductors and insulators.

A related object of the invention is to provide a novel method of obtaining selective free radical reactions upon a substrate surface.

A further object of the invention is to provide an improved method of fabricating solid state microminiature circuitry.

Yet another object of the invention is to provide an improved method of fabricating thin film superconductive circuits.

Still another object of the invention is to provide an improved method of fabricating thin film semiconductor circuits.

Another object of the invention is to provide an improved apparatus for fabricating microminiature solid state circuitry.

The foregoing and other objects, features and advantages of the invention will be apparent from the following more particular description of preferred embodiments of the invention, as illustrated in the accompanying drawings.

Figure 1:
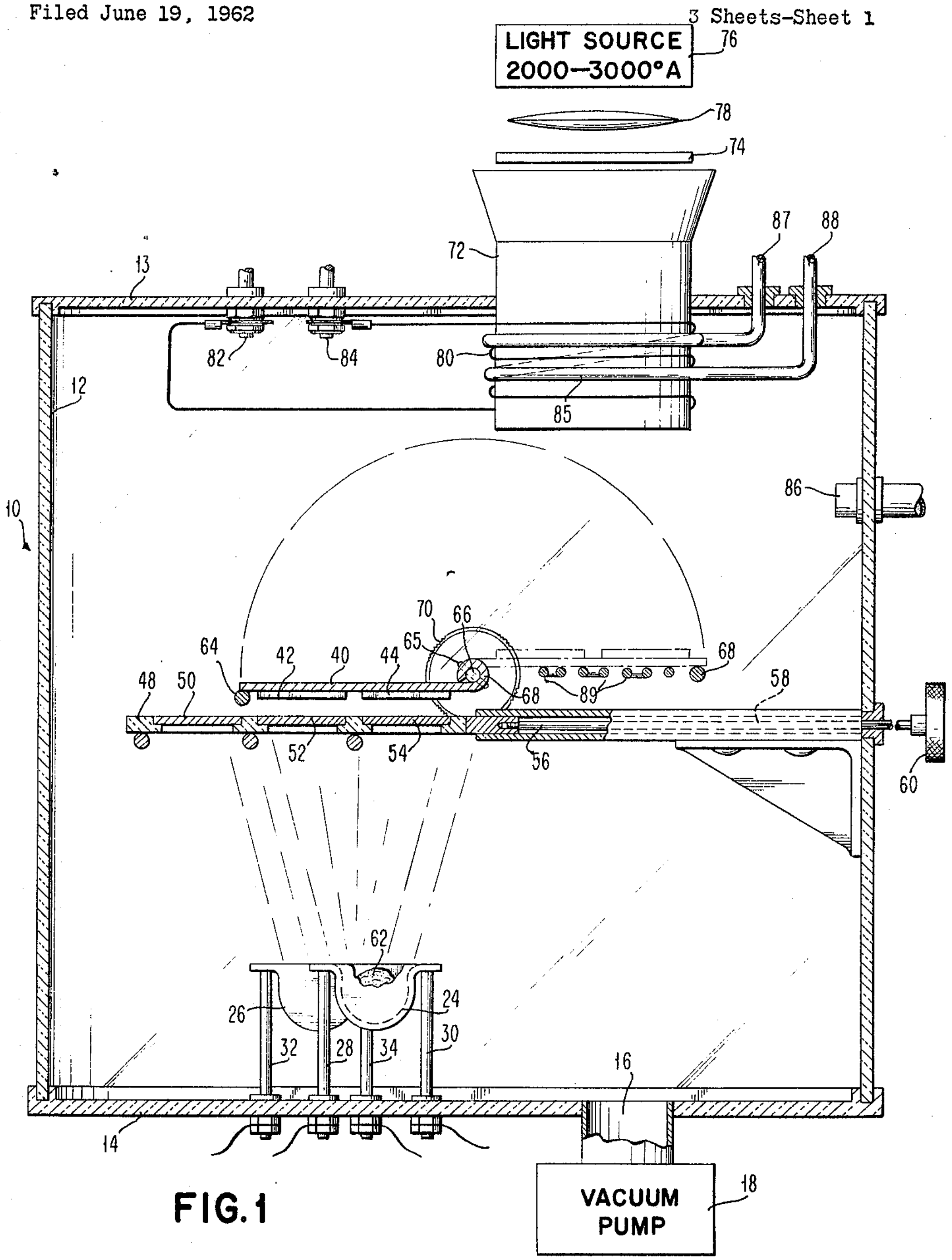
FIG. 1 illustrates an apparatus useful in practicing the method of the invention within an evacuated chamber.

Referring now to the drawings, there is shown in FIG. 1, an apparatus useful in practicing the method of the invention, it being understood that various modifications to the illustrative apparatus may be made as required. As shown, a vacuum chamber 10 comprises a cylindrical housing 12, which may be fabricated of either glass or metal, to which are secured upper and lower base plate members 13 and 14, respectively. An opening 16 is provided in lower base plate 14 through which is connected a conventional vacuum pump 18 which is used to both evacuate chamber 10 as well as to maintain a predetermined pressure therein. Pump 18 may include any of the various combinations of pumps presently employed in vacuum technology such as, by way of example, the combination of a rotary mechanical roughing pump and a high vacuum oil diffusion pump. Also, secured within chamber 10 and supported by lower base plate 14 are a pair of cuplike evaporation source structures 24 and 26. Each of these structures is secured to base plate 14 by a pair of rods 28 and 30 and 32 and 34, respectively. Since it is necessary to supply thermal energy to crucibles 24 and 26 in order to evaporate material contained therein, rods 28 through 34 may preferably be fabricated of copper and, further, extend, by means of conventional vacuum seals, through base plate 14 as shown. By coupling a source of low potential high current electrical energy to each pair of rods selectively and individually, thermal energy is supplied to sources 24 and 26 as a result of current flow therethrough. For this reason, sources 24 and 26 are each preferably fabricated of graphite, although other materials may be employed as may other methods of heating these sources such as inductive heating by way of example. Directly secured above the evaporation sources is a hinged substrate holder 40 to which are secured, by conventional means, a pair of substrates 42 and 44, a greater or lesser number of substrates being employed as required. Positioned intermediate of holder 40 and the evaporation sources is a mask holder 48 wherein individual masks are inserted to define predetermined geometric patterns upon substrates 42 and 44. Only three masks 50, 52, and 54 are illustrated in FIG. 1, it being understood that a greater or lesser number of masks may be employed as desired. In order to position particular masks between the individual substrates and the evaporation sources, means are also provided to longitudinally move mask holder 48 by means of a rack and pinion arrangement indicated generally as 56, driven external of chamber 10 through a shaft 58 coupled to knob 60.

The components of the system described above are those normally found in a vacuum deposition apparatus specifically designed to form multilayer thin film circuits. A typical sequence of operations of the above described apparatus comprises placing an evaporation charge in one or more of the source structures such as shown by a charge 62 located within chamber 24, positioning the desired mask adjacent substrate 42 upon which the layer of material 62 is to be formed, and supplying, after chamber 10 has been evacuated to a predetermined evaporation pressure, thermal energy to source 24 sufficient to raise the vapor pressure of charge 62 above the predetermined evaporation pressure. In this manner, vapors of the materials are directed upwardly from source 24 through the particular mask which defines the geometry of the layer being deposited upon substrate 42, and finally deposit in the defined geometric pattern upon the substrate. When a sufficient thickness of the deposit has formed, the supply of energy is terminated and, further, a movable shutter (not shown) may be interposed between the source and substrate to prevent additional particles of the charge from arriving at the substrate. Should a second layer be required upon the substrate, mask changer 48 is moved to position another of the masks between source 26 and the substrate and a similar evaporation is obtained from source 26, by applying thermal energy thereto. Further information on apparatus, materials and techniques employed in the fabrication of thin film circuits is found in the volume entitled, "Vacuum Deposition of Thin Films" by L. Holland, published in 1958 by John Wiley and Sons, Inc., New York.

As further shown in FIG. 1, additional equipment is incorporated in the apparatus which is particularly useful in practicing the method of this invention. Substrate holder 40 supported by a stop rod 64 and has one end connected to a hinge 66. Holder 40 is rotatable in a 180° arc about hinge 66 by means of a worm drive 65 coupled to shaft 68 and knob 70 to obtain the position shown in the dashed outline in FIG. 1 so as to be supported by a second stop rod 68. In this alternate position, the surfaces of the substrates are now positioned below a quartz light pipe 72 which extends through upper base plate 13. Further positioned above this light pipe, and external of the chamber, is a light mask holder 74. Finally, a source of light indicated generally as 76 and which includes selected optical filters is positioned above mask 74 from which light is directed thereto by means of a lens system 78. In this manner, light of a predetermined and selected wavelength is focused and directed through one or more masks positioned in holder 74, and thereafter conveyed by means of quartz pipe 72 through upper base plate 13 to the surfaces of the substrates. As more particularly explained hereinafter, source 76 is effective to generate light at a wavelength in the 2000 to 3000 Angstrom unit range, although other wavelengths can be employed to break the bonds of the particular materials selected according to the method of the invention as will be understood by those skilled in the art. For this reason, quartz is employed in light pipe 72 to convey this light, generated external of chamber 10, through the chamber walls and onto the substrate since it is essentially transparent to light of these wavelengths whereas glass or the like is opaque. Further, positioned about the lower end of pipe 72 is a coil of heating wire 80 connected to a pair of terminals 82 and 84 extending through upper plate 13. Coil 80 is effective, during certain photolytic operations, to prevent material from adhering to the surface of pipe 72 and thereby obstructing a portion of the light directed towards the substrate. In a similar manner, a cooling coil 85 is also positioned about the lower end of pipe 72. By means of an inlet port 87 and an outlet port 88, water or other similar fluid is caused to circulate through coil 85 and is effective during selected photoyltic operations to maintain pipe 72 at or about room temperature and prevent material from adhering to the surfaces thereof. Additionally, a heater element 89 is positioned adjacent to substrate holder 40 in the dotted position indicated in FIG. 1. Heater 89 is selectively operable to raise substrates 42 and 44 to an elevated temperature as required as will be more particularly understood as the description proceeds. Next, extending through the side wall of housing 12 is an inlet conduit 86 selectively connected to one or more sources of particular organic vapors (not shown) which are employed in the photolytic reactions, as more particularly described in the detailed description of the method of the invention to follow. It is thus seen that the apparatus illustrated in FIG. 1 comprises essentially a pair of systems for forming thin films upon the substrate, the first being a conventional thermal evaporation system and the second being the novel photolysis system of this invention.

Before proceeding with the detailed description of the several embodiments of this invention, a brief résumé of several types of solid sate circuitry is next briefly described. First, superconductive circuits may advantageously be employed in large scale electrical systems. By way of example, reference is first made to U.S. Patent No. 2,832,897, issued April 29, 1958 to D. A. Buck. This patent describes the basic building block of superconductive circuits, which is known as a cryotron. The cryotron consists, essentially, of a first, or gate, conductor about which is wound a second, or control, conductor. Each of these conductors is formed of a superconductive material, that is, a material which exhibits superconductivity below certain predetermined temperatures. Superconductivity is characterized by the absence of electrical resistance to the flow of an electric current. At the operating superconductive temperature, current flow through the control conductor is effective to generate a magnetic field of sufficient intensity to quench superconductivity in the gate conductor, the gate conductor then exhibiting normal electrical resistance. Moreover, the control conductor is generally fabricated of a material, different from the gate conductor material to exhibit superconductivity for all values of magnetic fields generated in the cryotron. Through the interconnection of various gate and control conductors of a number of cryotrons, various logical circuits have been designed, several of which are shown and discussed in the above patent.

The wire wound cryotron shown in the patent to Buck is inherently a relatively slow device. This results from the low value of resistance exhibited by the gate conductor when in the resistive state and the high value of inductance exhibited by the control conductor winding. For this reason, and together with the reasons for the microminiaturization of electrical circuits discussed above, improved cryotron type devices have been developed, one of which is described in copending application Serial No. 625,512, filed November 30, 1956, on behalf of Richard L. Garwin and assigned to the assignee of this invention. These improved cryotron-type devices include a first thin film operable as the gate conductor having associated therewith a second thin film insulated from the first which is operable as the control conductor. Further, a superconductor shield is also employed which is effective to reduce the inductance of the component to obtain increased switching speed; also, the resistance of the gate conductor is increased through the use of the thin film form of gate conductor. Devices of this improved type may be advantageously fabricated through the method of this invention as described in detail hereinafter.

With respect to semiconductor devices and circuits formed thereby, reference may be had to U.S. Patent No. 2,655,625 entitled Semiconductor Circuit Element, issued October 13, 1953, to E. T. Burton which shows complex semiconductor circuits fabricated of a single block of semiconductor material. Circuits of this type, as well as semiconductor circuits in general, may also be advantageously fabricated by means of this invention as is also described in detail hereinafter. Semiconductors are broadly classified as conductors which exhibit a resistivity value intermediately between conventional conductors and insulators. Specifically, semiconductors are divided broadly into two groups, the first, or N-type semiconductors, contain an excess of electrons, or negative current carriers, and the second, or P-type semiconductors, contain an excess of "holes," or positive current carriers. N and P-type materials are determined by the predominant number of excess impurities in the semiconductor material. Although many types of impurities and semiconductive materials have been developed, the majority of these devices are fabricated of germanium or silicon to which impurities of the group III elements of the periodic table are added to produce P-type conductivity or, alternatively, group V elements of the periodic table are added to produce N-type conductivity. By forming one or more contiguous regions of N and P-type materials, diodes, transistors, and tunnel diodes have been fabricated, and it is to devices of this type and combinations thereof to which the method of the invention in one embodiment is particularly adapted.

Before describing in detail illustrative examples of the method according to the invention applied to the fabrication of solid state circuitry, the basic theory of the invention together with several specific examples of photolytic reactions possible through the invention are next discussed to indicate the wide range of embodiments afforded by the invention. In each of the specific examples following, note should be made of the fact that by proper selection of both temperature and pressure the indicated reactions are confined to the surface of the substrate only. It has been known that many organic compounds can be elevated to excited states by absorption of radiation at a predetermined wavelength. Molecules in these excited states may then react with unexcited molecules or, alternatively, may decompose to yield products which may or may not be stable. When these products are not stable, a further reaction may occur with unexcited molecules to yield further products and often a complex chain reaction can occur before the final stable products are formed. Many ordinary vapors have absorption bands in the ultraviolet wavelength range and, by means of proper controls, the photolytic reaction process is confined to an adsorbed layer. This has been shown by a reaction occurring between methyl iodide and hydrogen iodide which takes place in an adsorbed layer of the methyl iodide at a wavelength in excess of 3000 Angstrom units whereas the gaseous methyl iodide adsorbs energy only at wavelengths less than 2700 Angstrom units. According to theory, less energy, that is, a longer wavelength, is required to decompose or break the bonds in an adsorbed molecule over that required in a molecule in the gase phase as a result of the weakening of the bonds upon adsorption. Experiments undertaken in the development of this invention have shown conclusively that a surface photolytic reaction, that is, a photolytic reaction upon an adsorbed layer, takes place preferably to gas phase photolytic reaction under controlled conditions. It has further been found that decomposition of both methyl iodide and butadiene, by way of example, can be initiated upon metal or other surfaces illuminated by ultraviolet light, and this reaction is selectively controllable to occur only on those parts of the surface illuminated by ultraviolet light. In this manner, that is, by selectively directing light upon a surface in the desired geometric pattern, it is possible to preferentially select areas of the surface to which the reaction is confined.

The resolution of the geometric pattern formed by this method depends upon two factors. The first of these factors is the definition with which the image can be focused upon the surface. This resolution is determined solely by the optical system employed. The second of these factors in the migration rate of the decomposition products, which is dependent upon the relative ratio of the reaction rate and the surface diffusion of the photolyzed particles. Since in a free radical reaction, the lifetime of the unstable intermediate products is limited to about 1 millisecond before further reactions occur, the definition afforded by the optical system is essentially resolved upon the surface whereat the reaction occurs. In general, thermal evaporation of the material through a pattern defining mask, whether an insulating material or metallic material is limited, to approximately 1 thousandth of an inch. By the method of the invention, however, circuits having widths in the order of 10,000 Angstrom unit range are attained.

Consider next the photolytic reaction effective to etch a thin metallic film to obtain a desired metallic thin film configuration. After a thin metallic film has been deposited upon the entire surface of a substrate within an evacuated chamber by means of, by way of example, thermally evaporating the metallic material onto the substrate, the exacuated chamber is employed to insure that the thin metallic film is relatively free of any oxide coating. The introduction of an organic vapor capable of forming free radicals in a photolytic reaction with light of a predetermined wavelength and the reaction of an adsorbed layer of such vapor is thereafter effective to remove those portions of the metallic film which are not necessary in the desired configuration. By way of example, the introduction of a methyl halide, such as methyl iodide or methyl bromide, to the evacuated chamber at a pressure of about 1 mm. Hg is effective to cause an adsorbed layer of this halide to coat the surface of the substrate upon which the thin metallic film has previously been deposited. Next, the subsequent direction of light through the gaseous halide onto the metallic film in a predetermined pattern is effective to remove the metal film from the substrate in those areas to which the light is selectively directed. When irradiated by ultraviolet light of between 2600 to 3000 Angstrom units, decomposition of the adsorbed layer occurs on the surface and forms a methyl free radical and an iodine or bromine radical. When a methyl halide is photolyzed in the gas phase, the methyl free radicals react further with the gas phase components forming primarily methane and ethylene. The methyl free radicals have a lifetime of about $1\times10^{-3}$ seconds. However, the methyl radicals formed in the adsorbed layer at the surface of the unoxidized metal film react with the film forming a volatile methyl metal compound thereby removing the metallic film from those areas illuminated by the ultra violet light. Thus, when methyl iodide or methyl bromide are adsorbed on the surface of a clean metal film which is illuminated with ultraviolet light, a surface photolytic process selectively takes place. Methyl radicals are formed in this pohtolysis reaction and the metal selected is capable of forming a volatile methyl compound, by way of example, lead and tin each react with the methyl radicals to form volatile compounds; the metal film thereby being selectively removed. This reaction is not limited to methyl free radicals, however, and any free radicals capable of forming volatile metal compounds may be employed. Metals such as lead, antimony, zinc, bismuth, tin, cadmium, tellurium, lithium, sodium, potassium, calcium, mercury, arsenic, and beryllium can be selectively removed by means of a surface photolysis reaction, as above described. This process is cumulative upon the surface region of the metal film being vaporized in the form of a methyl compound, subsequent adsorbed layers of the methyl halide being formed on the metallic film and further free radical reactions continue until all of the metal film in the illuminated areas of the substrate is volatilized. This surface photolytic reaction is performed selectively whereby predetermined areas of the metallic film are preferentially removed by illuminating those areas of the metal film with a pattern of light. Experiments have shown that desired portions of approximately 2000 Angstrom thick tin films, as well as lead films, are preferentially removed by this reaction. This method is especially suited for the production of micro-miniaturized circuits since the size of the mask which determines the area being preferentially etched can be of any convenient size; the directed pattern of light defined by this mask thereafter being focused by optical means to produce the required pattern size upon the surface of the substrate. Further, this reaction can be attained by first depositing the metal in a pattern which corresponds roughly to the final desired configuration, the photolytic reaction thereafter being employed to precisely determine the dimensions of the finished circuit. Upon the desired geometry being attained, the supply of the methyl halide is terminated, and a vacuum pump is operated to remove the gaseous halide as well as the undecomposed layer adsorbed upon the substrate surface from the system.

A related photolytic reaction can be obtained by bleeding into an evacuated chamber a metal alkyl vapor compound, and, by properly controlling the pressure of the compound and the temperature of the substrate, forming an adsorbed layer of the compound upon the substrate surface. Thereafter, selectively directing a light pattern upon the surface of the substrate is effective to decompose the compound, resulting in the metal being selectively deposited upon the substrate. Most gaseous metal alkyl compounds such as $Sn(CH_3)_4$, $Sn(C_2H_5)_4$, $Pb(CH_3)_4$ $Pb(C_2H_5)_4$, $Ge(CH_3)_4$, $Si(CH_3)_4$, etc., are stable at room temperatures. The stability of such compounds decreases as temperature increases until they thermally decompose at about 600° C. forming the metal and a series of organic compounds. By the method of this invention, the decomposition can be initiated photolytically by means of ultraviolet light at temperatures between 200 and 300° C., the photolytic reaction yielding the identical products as the thermal decomposition. The previously named compounds can be photolytically decomposed at about 250° C. and, as a further example, dimethyl cadmium is photolytically decomposed at 200° C. Therefore, positioning a substrate within an evacuated chamber, heating the substrate to about 250° C., and supplying a metal alkyl at a predetermined pressure, a layer of this compound will be adsorbed upon the substrate. Next, the introduction of light in a desired pattern is effective to decompose the adsorbed compound only in those regions of the substrate illuminated by the ultraviolet light, thereby selectively depositing the metal on the illuminated regions of the substrate. To insure an uninterruped supply of ultraviolet light, the light pipe conveying the light from a source external of the chamber to the substrate surface is maintained at approximately room temperature in order to prevent surface decomposition of any metal alkyl adsorbed thereon. At this time, the supply of the metallic alkyl is terminated, and the pressure within the chamber is reduced to a limiting pressure at which all of the adsorbed compound which has not been decomposed is removed from the substrate. In this manner, selective deposition of metallic films is attained through the decomposition of an adsorbed metal alkyl compound upon the substrate.

Again, by means of a similar reaction employing different materials, it is possible to form an insulating layer in a predetermined pattern by reacting photolytically a monomer gas or vapor which, when irradiated by light of a predetermined wavelength, forms free radicals which further interact with one another to form an electrically insulating solid polymer film coating. This reaction occurs when the organic molecules, excited by the radiated light, react with a normal molecule or another excited molecule to form a long chain polymer or, alternatively, decompose into active fragments which are themselves capable of reacting one with another or reacting with other more stable components within the system to yield the polymer insulating films. It is evident that electron or ion beam bombardment can be used to achieve a similar effect on the chemisorbed layer. In accordance with good vacuum techniques, it is preferred to employ hydrocarbons of low molecular weight, such as ethylene or butadiene, to form the insulating layers since these low molecular weight hydrocarbons are easily removed from the vacuum system in contradistinction to the heavy hydrocarbon vapors which lead to contamination of the vacuum system. Since this photolytic reaction occurs at room temperature, it is desirable to maintain the light pipe conveying the light from a source external of the chamber to the substrate surface at an elevated temperature to again insure that no reaction products adhere thereto.

Further, the method of the invention is also adaptable to form thin film magnetic circuits wherein the circuits are defined by a predetermined geometric configuration. The required steps include forming a thin magnetic coatnig upon a substrate positioned within a vacuum chamber, and thereafter selectively forming a stable solid long chain polymer thereon as a negative of the required circuit geometric configuration by means of the photolytic reaction of a low molecular weight hydrocarbon, such as butadiene or ethylene, as described above. Thereafter, the thin magnetic film, left unprotected by the polymer, is preferentially etched, chemically or otherwise, to remove all magnetic material not coated by the polymer selectively deposited in the circuit configuration. Finally, dissolving or depolymerizing the polymer is effective to expose the magnetic circuit configuration. Accordingly, patterns of polymerized monomer gases when formed as herein above described can be employed as either an acid resist or a plating resist.

Figure 2A:
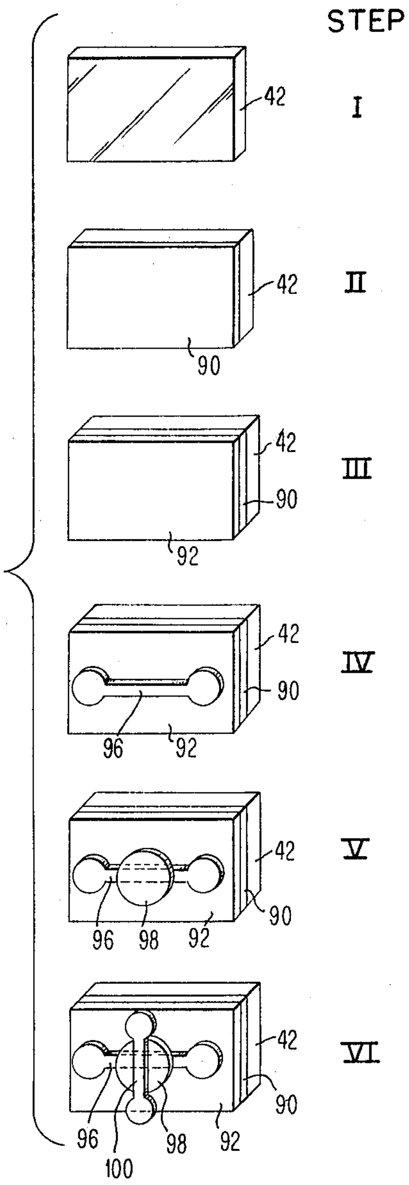
FIG. 2A illustrates the various layers formed upon a substrate during the fabrication of a superconductive component according to the method of the invention.
Figure 2B:
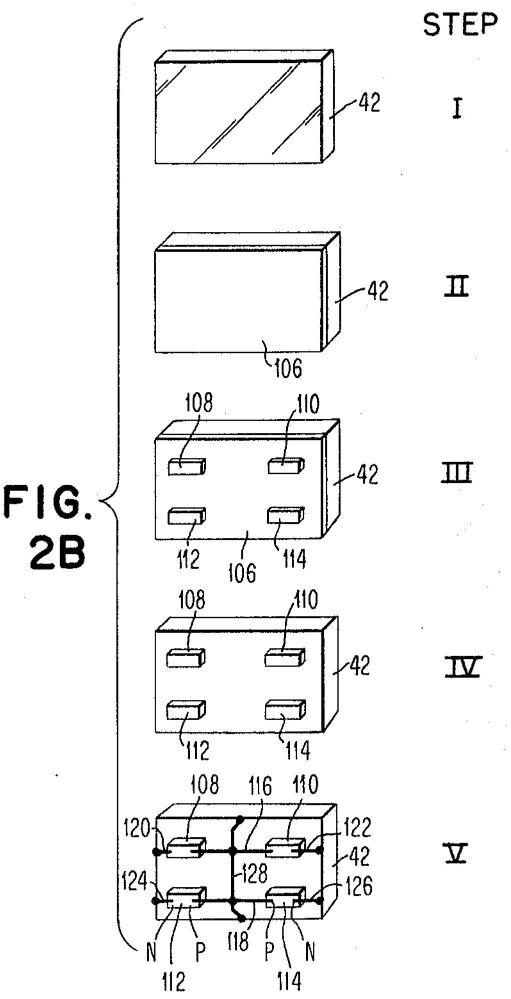
FIG. 2B illustrates the various layers formed upon a substrate during the fabrication of a semiconductor circuit according to the method of the invention.

For a more complete understanding of the method of the invention, reference should now be had again to the drawings which shown in FIGS. 2A and 2B several microminiature circuits fabricated according to the method of the invention. FIG. 2A shows a particular sequence of steps in the formation of a thin film superconductive cryotron of the type disclosed in the above referenced Garwin copending patent application, it being understood that a plurality of cryotrons together with their interconnections could simultaneously be fabricated. Further, the particular sequence chosen by way of illustration includes the formation of a pair of coatings by conventional vacuum deposition techniques, the remainder of the required coatings being thereafter obtained by means of several photolytic reactions as discussed above. As shown in step I of FIG. 2A, the initial step in the fabrication of the thin film cryotron is to provide a clean substrate of glass or the like which forms a support for the cryotron. Referring at this time also to FIG. 1, the substrate 42 is shown positioned in holder 40 below which is positioned at mask 52. During the first steps in the fabrication of the cryotron, according to the invention, it is not necessary to employ a pattern defining mask; therefore, mask 52 has an opening significantly larger than substrate 42. At this time source 24, which contains a charge of lead, is subjected to an elevated temperature to evaporate a portion of the charge therein. This charge is directed through open mask 52 onto the surface of substrate 42 to coat substrate 42 with a layer 90 of lead, as shown in step II of FIG. 2A, having a thickness of approximately 1000 Angstrom units, this lead layer thereafter being effective as the superconductive circuit shield as described in the Garwin reference. The next step in the process is to subject source 26, which contains a charge of silicon monoxide, to an elevated temperature to direct the evaporated portion of this material through mask 52 onto substrate 42. Again, the material covers the entire face of substrate 42 thereby providing an insulating layer 92, indicated in step III of FIG. 2A, which completely covers lead layer 90. Next, holder 42 is rotated 180° about hinge 66 to obtain the position indicated by the dash lines in FIG. 1. At this time, a light mask which defines the geometry of the gate conductor of the cryotron being fabricated is positioned within holder 74 and gaseous tetramethyl tin is bled into evacuated chamber 10 through opening 86 forming an adsorbed layer or tetramethyl tin on the surface of substrate 42, completely covering layer 92. Next, heater 89 is operated to raise the temperature of substrate 42 to a temperature of about 250° C. Further, at this time a source of water, or other coolant, is connected to inlet and outlet ports 87 and 88 to maintain the temperature of quartz light pipe 72 at approximately room temperature in order to prevent the formation of tin thereon which would thereby obstruct the flow of light through pipe 72. Room temperature has been found sufficient to prevent any metallic tin from forming upon the surfaces of pipe 72. Next, light source 76 is energized to direct the predetermined pattern of ultraviolet light upon the surface of substrate 42. Since, as stated above, there is present upon insulating layer 92 of substrate 42 an adsorbed layer of tetramethyl tin, the portion of this layer irradiated by the ultraviolet light is converted to metallic tin. This reaction proceeds at a rate of approximately 30 Angstrom units per minute. Upon obtaining a predetermined thickness of metallic tin, the introduction of the vapor through conduit 86 is terminated, and vacuum pump 18 is thereupon effective to remove the gaseous tetramethyl tin present within the chamber 10 and, further, to desorb the undecomposed layer of this compound adhering to the surface of substrate 42. At this time, the cooling of pipe 72 and the heating of substrate 42 are discontinued. At the end of this step, the surface of substrate 42 is that shown in step IV of FIG. 2A wherein the metallic tin has been formed upon insulating layer 92 in the pattern illustrated by configuration 96.

The next step in the formation of the thin film cryotron is to replace the light mask in holder 74 with a mask which defines the next layer to be formed, this layer being the insulating layer required to insulate the gate and control conductor of the cryotron. Next, a source of electrical potential (not shown) is connected to terminals 82 and 84 which is effective to raise quartz pipe 72 to a temperature of about 300° C., thereby insuring that an insulating film will not be formed upon pipe 72. At this time, a source of butadiene is introduced through conduit 86 at a predetermined pressure sufficient to form an adsorbed layer upon the upper surface of substrate 42. Upon this adsorbed layer being attained, light is again directed through the lens system 78, the light mask within holder 74, and through the heated light pipe 72 onto the surface of substrate 42 and, as explained above, preferentially forms a solid long chain polymer in the pattern determined by the light mask at a rate of about 20 Angstrom units per minute. However, this rate depends upon the particular vapor selected and note should be made of the fact that additional vapors can be included within chamber 10 to modify the reaction rate. Again, the light source is terminated as is the source of butadiene connected to conduit 86 and the potential supplied to terminals 82 and 84, and vacuum pump 18 again reduces the pressure within chamber 10 sufficiently to both remove the butadiene vapors as well as the adsorbed butadiene layer on substrate 42 which has not been converted to a long chain polymer through the action of the irradiated light. This insulating layer is shown in step V of FIG. 2A indicated by reference numeral 98. Again, the light mask is changed to that which defines the necessary pattern for the control conductor and a source of tetramethyl lead is introduced through conduit 86 at a selected pressure such that again an adsorbed layer is formed upon substrate 42. Coolant is supplied to coil 85 to maintain pipe 72 at approximately room temperature and the substrate is raised to the required temperature. Again, the action of the light pattern defined by the light mask in holder 74 is effective to photolytically react throughout the illuminated area of the adsorbed layer and decompose the adsorbed layer to form a metallic lead configuration. Finally, the light source and the flow of tetramethyl lead are each terminated and vacuum pump 18 removes all of the adsorbed layer of tetramethyl lead not decomposed through the photolytic reaction. At this time, the substrate is returned to room temperature and the coolant flow is discontinued. Thus, the thin film cryotron shown in step VI of FIG. 2A and fabricated through the particular sequence of steps described above includes a lead superconductive shield 90, an insulating layer 92, a thin film gate conductor 96, crossed by a thin film control conductor 100 which is insulated from the gate conductor by further insulating layer 98. As is well known, the gain of a thin film cryotron is essentially determined by the ratio of the width of the gate conductor divided by the width of the control conductor so that the control conductor is generally a fraction of the width of the gate conductor. For reasons of clarity, these dimensional differences are not emphasized in FIG. 2A in order that the fabrication details may better be understood. For microminiaturization of thin film superconductive circuits, the gate conductors preferably have a width in the order of 100,000 Angstrom units, and thin film cryotrons exhibiting a theoretical gain of 10 or more are readily fabricated in quantity by the method afforded by the invention. Further, it should be understood that a thin film cryotron can be fabricated by other sequence of steps wherein the method of the invention is utilized. By way of example, insulating layer 92 could be covered entirely by a layer of tin deposited through conventional vacuum deposition techniques and thereafter a photolytic reaction could be employed to remove all of the deposited tin layer except that required for gate conductor 96. Alternatively, gate conductor 96 could be formed through the conventional evaporation of tin through a pattern defining mask or by the photolytic decomposition of a tin-base alkyl compound and a portion thereof photolytically removed, if desired. Thereafter, the control conductor 100 is formed through a photolytic reaction. Thus, it should be noted that various combinations of the sequence of steps can be employed in the formation of the thin film cryotron as desired.

For further understanding of the advantages afforded by the method of the invention, a further particular sequence of steps is illustrated in FIG. 2B to fabricate an elementary semiconductor circuit. Again, the sequence of steps begins with a clean substrate 42 as shown in step I of FIG. 2B which, depending on circuit applications, may be glass, metallic, or semiconductive material such as germanium or silicon. Substrate 42 is positioned in holder 40 in the dashed position shown in FIG. 1 immediately below light pipe 72. The chamber is then evacuated and a mask is positioned in holder 74 as determined by the circuit configuration. Next, dimethyl germanium is introduced through conduit 86, again at a pressure such that a layer is adsorbed upon the upper surface of heated substrate 42, pipe 72 being maintained at room temperature. This layer is indicated by reference numeral 106 in the step II in the sequence illustrated in FIG. 2B. Light source 76 is next operated to selectively decompose portions of coating 106 to germanium. By way of example, as shown in step III of FIG. 2B, four areas of layer 106, indicated as 108, 110, 112, and 114, are converted to germanium. Again light from source 76 and the source of dimethyl germanium connected to conduit 86 are terminated and the continued operation of vacuum pump 18 is effective to remove all of the previously adsorbed layer 106 of substrate 42 except for those regions converted to germanium, as indicated in step IV of FIG. 2B. Finally, through a like sequence of operations interconnection lines are formed upon the surface of substrate 42, as required, by the circuit design. By way of example, a pair of zinc lines 116 and 118 are deposited to connect germanium die 108 to germanium die 110, and germanium die 112 to germanium die 114, respectively. Next, each of the germanium dies are further connected by additional lines which may be preferably of antimony as indicated by lines 120, 122, 124 and 126. Finally, a further interconnection line 128 of any selected material may also be deposited. Thereafter, the substrate with the interconnection lines deposited as shown is raised by means of heater 89 to an elevated temperature sufficient to diffuse a portion of the interconnection lines secured to the germanium dies into and through the germanium to alter the conductivity thereof. For interconnection lines as described above comprising zinc and antimony, the diffusion of zinc into and through each of the dies is effective to convert this diffused region to P-type conductivity and, conversely, the diffusion of the antimony is effective to form N-type conductivity regions. In each of dies 108, 110, 112 and 114 the P and N-type regions contact in a barrier which forms a PJ-N junction. Thus, each of the four wafers as shown are converted to conventional P-N diodes. It should now be obvious that, through a further sequence of steps and operations, more advance devices such as transistors, tunnel diodes, and the like may be selectively formed upon the surface of the substrate. Thus, a particular sequence of steps have been illustrated which is readily adaptable to form complex microminiaturized semiconductor circuits in quantity.

Figure 3:
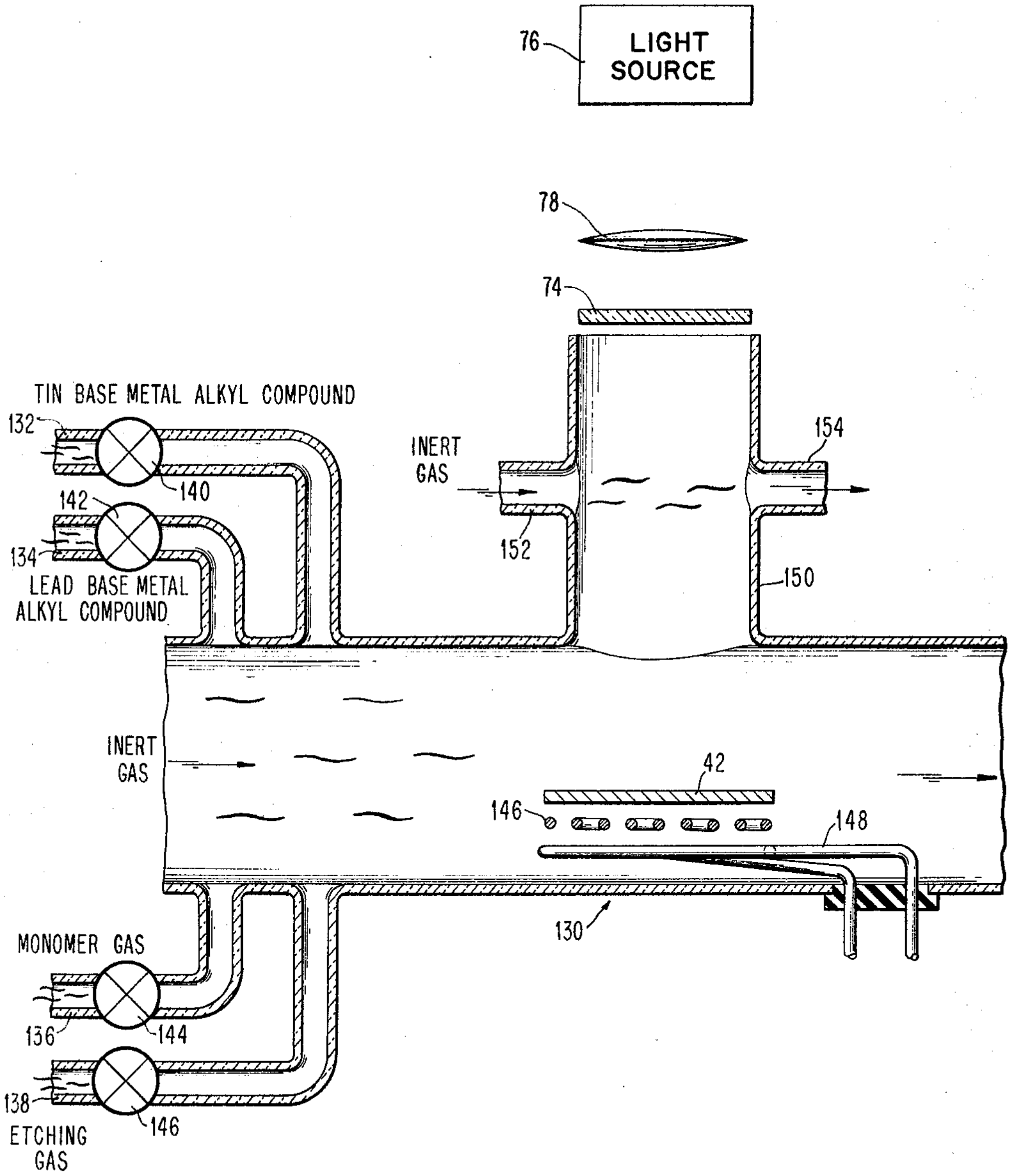
FIG. 3 illustrates an apparatus useful in practicing the method of the invention in an inert atmosphere and at atmospheric pressures.

Apparatus for practicing each of the surface photolytic processes hereinabove described at atmospheric pressures is shown in FIG. 3. In FIG. 3, the substrate whereon the photolytic processes are to be effected is normally contained in an inert atmosphere, e.g., helium, argon, etc., in lieu of the reduced pressures maintained within vacuum chamber 10 of FIG. 1. The inert atmosphere, as is also true of vacuum chamber 10 of FIG. 1, prevents adsorption of oxygen and other foreign gases on the surface of the substrate 42 during the fabrication process which could interfere with the photolytic reactions to be effected. The inert atmosphere is particularly selected to be (1) non-reactive with the substrate material, any of the organic vapors employed in the fabrication process, and any by-products of the photolytic reactions to be effected; (2) not chemisorbed so as to insure the formation of uniformly-pure adsorbed layers of organic vapors on substrate 42; and (3) non-adsorptive of light of those particular wavelengths by which each of the adsorbed layers of organic vapors are photolytically reactive.

The apparatus of FIG. 3 includes a main conduit 130 along which an inert gas, e.g., helium, flows continuously from right to left; main conduit 130, for example, is connected at the open left end to a source of helium under pressure, not shown, and at the open right end to an exhaust means, not shown. Main conduit 130 includes a number of bleed-in taps 132, 134, 136 and 138 each connected to a pressurized source, not shown, of a particular organic vapor useful in the fabrication process; bleed-in taps 132, 134, 136 and 138 include valves 140, 142, 144 and 146, respectively, for introducing predetermined partial pressures of the particular organic vapors individually and in selected sequence along main conduit 130 so as to be mixed in the helium flow. Substrate 42 is positioned along main conduit 130 and is bathed continuously with helium and also with a selected organic vapor when introduced along the main conduit. As helium is not chemisorbed, a uniformly-pure adsorbed layer of the selected organic vapor to be photolytically reacted is formed over substrate 42. Since different organic vapors are more readily photolytically reacted at different temperatures, a heater element 146 and also a cooling coil 148 of similar type shown in FIG. 1 are positioned in close proximity to substrate 42.

The main conduit 130 also includes a tubular extension 150 whose axis is normal to the plane of substrate 42 and having axially-aligned tubular input and output ducts 152 and 154. Helium is directed into input duct 152 and exhausted from the output duct 154 to provide a gas barrier for preventing ingress of contaminating foreign gas, e.g., oxygen, and also egress of organic vapors along the tubular extension 150.

An optical arrangement substantially similar to that shown in FIG. 1 is positioned above the open end of tubular extension 150. The optical arrangement comprises a light source 76 including selected optical filters for irradiating adsorbed layers of organic vapors formed in turn over the substrate 42. As hereinabove described, the particular wavelength of light directed onto each adsorbed layer is effective to photolytically react so as to break the bonds of the constituent organic compound whereby a photolytic reaction can be supported. The light from the source 76 is collimated by a lens system 78 and directed through a particular pattern mask in holder 74 interposed between the lens system and the substrate 42. Accordingly, light directed along the tubular extension 150 is defined in predetermined patterns whereby only selected portions of an adsorbed layer formed on substrate 42 are irradiated and photolytically reacted. It is to be noted that the quartz window 72 shown in FIG. 1 is omitted and the fabrication process is practiced in a substantially similar fashion in a helium, i.e. an inert, atmosphere. In the illustrated embodiments, the vacuum and the inert atmosphere, respectively, provide that the fabrication process is practiced in a non-corroding medium.

When valves 140, 142, 144 and 146 are opened in predetermined sequence, organic vapors are selectively introduced along the main conduit to form adsorbed layers in turn over substrate 42. When an adsorbed layer has been formed, light source 76 is operated to irradiate the adsorbed layer with a selected light pattern of predetermined wavelength and as defined by a particular pattern mask positioned in holder 74. Accordingly, selected portions of the successively-formed adsorbed layers are photolytically reacted to form the desired geometries of, for example, the ground plane, the gate conductor, the control conductor and insulating layers of a thin film cryotron as illustrated in FIG. 2A. Adsorbed layers not photolytically reacted are removed by desorption in the helium flow over the surface of the substrate intermediate successive photolytic reactions.

When a thin film cryotron, for example, is formed in accordance with the steps illustrated in FIG. 3A on a metallic substrate, it is preferred that a thin insulating film of a polymerized monomer gas, e.g., butadiene, is deposited directly on the surface of substrate 42. For example, the initial step of the fabrication process is to open the valve 144 whereby a partial pressure of butadiene, e.g., to 15 mm. of Hg, is introduced in the helium flow along main conduit 130 to form an adsorbed layer over substrate 42. When irradiated, the adsorbed layer of butadiene forms free radicals which react one with the other to form a solid polymer film. Subsequent steps of the fabrication process are substantially identical to those hereinabove described with respect to FIG. 3A but for the fact that the layer of lead 90 forming the superconductive circuit shield 90 and the insulating layer 92 are formed by the photolytic decomposition of an adsorbed layer of lead-base alkyl compound, e.g., tetramethyl lead, and the polymerization of an adsorbed layer of butadiene, respectively, as hereinabove described. Subsequently, the cryotron structure is fabricated by the selective photolytic decomposition of a tin-base alkyl compound, e.g., tetramethyl tin, and a lead-base alkyl compound, e.g., tetramethyl lead, to form the gate conductor 96 and the control conductor 100, respectively, with an intermediate step of polymerizing a spot of butadiene as insulating layer 98, as shown. It should be noted, however, that gate conductor 96 can be formed by the selective etching of a thin film previously formed by the photolytic decomposition of an adsorbed layer of a tin-base alkyl compound. For example, a methyl halide, e.g., methyl iodide, methyl chloride, etc., or other etching gas can be introduced via bleed-in tap 138 and through valve 146 along the main conduit 130 to selectively etch portions of the thin tin film, as hereinabove described. Conversely, the control conductor 100 can be formed by the selective etching of a thin lead film previously formed by the photolytic decomposition of an adsorbed layer of lead-base alkyl compound. The thin lead film is deposited so as to be electrically insulated from gate conductor 96, for example, by increasing the surface area of the polymerized butadiene spot 98, and confining the etching process within said surface area so as not to damage the gate conductor. In either event, the resultant product is a cryotron substantially as shown in FIG. 3A, step VI.

It should be evident that the above-described techniques can be applied to numerous technologies. For example, two or more organic vapors can be introduced concurrently along the main conduit 130 so as to form a composite adsorbed layer on substrate 42. When this composite layer is irradiated by a light pattern of wavelengths to which each of the constituent organic vapors are photolytically reactive, a composition film results. This technique can be used, for example, to fabricate resistive elements in microminiaturized circuitry. A metal alkyl compound, e.g., tetramethyl lead, and a dielectric material, e.g., butadiene, can be introduced along the main conduit 130 via bleed-in taps 134 and 136, respectively; the composition of the composite adsorbed layer formed on substrate 42 and, hence, the resistivity of the resulting resistive element is determined by the ratio of such materials in the gas phase. The resulting film is a uniform mixture of metal and dielectric material and can be formed in any configuration.

It should be noted that since light is employed in each of the above described photolytic reactions, large area substrates are conveniently employed in contradistinction to conventional thermal evaporation of materials where relatively small substrates are necessarily employed to obtain uniform thickness coatings about the surface. Further it should be noted that particular materials, times, and pressures have been stated only by way of example, it being understood that in extremely wide range of materials and the specific operating conditions may be employed without departing from the spirit of this invention.

While the invention has been particularly shown and described with reference to preferred embodiments thereof, it will be understood by those skilled in the art that various changes in form and details may be made therein without departing from the spirit and scope of the invention.

What is claimed is:

1. A method of forming a thin film of material in a precise geometric pattern upon the surface of a rigid substrate positioned within a chamber comprising the steps of introducing into said chamber a vapor of a material capable of being photolytically reacted; said vapor capable of being photolytically reacted in the gas phase by light of a first predetermined wavelength and when adsorbed upon said substrate surface by light of a second predetermined wavelength; controlling the pressure of said vapor to form an adsorbed layer of said vapor upon said substrate surface; and directing light of said second predetermined wavelength through said chamber and onto said substrate surface to react said adsorbed layer in said geometric pattern; said vapor when reacted forming a thin film of said material on said substrate surface.

2. A method of forming a thin film of material in a precise geometric pattern upon the surface of a rigid substrate positioned within a chamber comprising the steps of introducing into said chamber a vapor of a material capable of being photolytically reacted in the gas phase by light of a first predetermined wavelength; controlling the pressure of said vapor to form an adsorbed layer of said material upon said substrate surface; said adsorbed layer capable of being photolytically reacted by light of a second predetermined wavelength; said second predetermined wavelength being greater than said first predetermined wavelength; and directing light of said second predetermined wavelength through said chamber and onto said substrate to react said adsorbed layer in said geometric pattern.

3. A method of forming a layer of material in a predetermined geometric configuration upon a rigid substrate within an evacuated chamber, which method comprises the steps of positioning said substrate within said chamber in light receiving relationship with an optical projection system; supplying to said chamber a vapor of a material capable of being photolytically reacted in the gas phase by light of a first predetermined wavelength and when adsorbed on the surface of said substrate by light of a second predetermined wavelength; controlling the pressure of said vapor to form an adsorbed layer of said material upon the surface of said substrate; operating said optical system to project a light pattern of said second predetermined wavelength and corresponding to said geometric pattern onto said adsorbed layer to preferentially react selected areas of said adsorbed layer; establishing said optical system at a temperature to prevent the formation of an adsorbed layer thereon; and terminating the supply of said vapor and reducing the pressure of said vapor within said chamber to desorb unreacted areas of said adsorbed layer from the surface of said substrate.

4. A method of removing portions of a thin metallic film to define a residual precise geometric pattern of said thin metallic film upon a rigid substrate positioned within a chamber, which method comprises the steps of depositing a thin metallic film on said substrate; introducing into said chamber an organic vapor capable of being photolytically decomposed in the gas phase by light of a first predetermined wavelength to form at least one free radical reaction product; controlling the pressure of said organic vapor in said chamber to form an adsorbed layer on said metallic film while at room temperature; directing light of a second predetermined wavelength through said chamber and onto said adsorbed layer in a predetermined pattern which defines the negative of said geometric pattern; light of said second predetermined wavelength being effective to decompose said adsorbed layer to form a free radical reactive with said metallic film to form a volatile compound therewith, irradiating said adsorbed layer with light of said second predetermined wavelength for a time sufficient to react said metallic film and form said geometric pattern; and reducing the pressure within said chamber to remove portions of said adsorbed layer not decomposed by said light of said predetermined wavelength.

5. A method of forming a thin film of material in a precise geometric pattern upon the surface of a rigid substrate positioned within a chamber comprising the steps of introducing into said chamber the vapor of a metal alkyl compound capable of being photolytically decomposed by light of a first predetermined wavelength when in the gas phase and by light of a second predetermined wavelength when adsorbed on said substrate surface; controlling the pressure of said vapor to form an adsorbed layer of said compound upon said substrate surface; subjecting said substrate to an elevated temperature; and directing a light pattern of said second predetermined wavelength through said chamber and onto said substrate surface to decompose selected portions of said adsorbed layer to form a metallic layer.

6. A method of forming a thin film of material in a precise geometric pattern upon the surface of a rigid substrate positioned within a chamber comprising the steps of introducing into said chamber a monomer gas capable of being photolytically reacted by light of a first predetermined wavelength when in the gas phase and by light of a second predetermined wavelength when adsorbed on said substrate surface; controlling the pressure of said gas to form an adsorbed layer of said monomer gas upon said substrate surface; directing a light pattern of said second predetermined wavelength through said chamber and onto said adsorbed layer to react selected portions of said adsorbed layer to form a stable solid long chain polymer; and terminating the supply of said monomer gas and thereafter reducing the pressure within said chamber to desorb unreacted portions of said adsorbed layer.

7. A method of forming precision multilayer microminiature thin film circuitry upon the surface of a rigid substrate positioned within an evacuated chamber comprising the steps of depositing selected thin film layers upon said substrate by thermally evaporating selected materials to deposit through selected pattern defining masks onto said substrate surface; and depositing remaining thin film layers by introducing into said chamber in turn vapors of selected materials capable of being photolytically reacted in the gas phase by light of a first predetermined wavelength and when adsorbed upon said substrate surface by light of a second predetermined wavelength, each of said remaining thin film layers being formed by controlling the pressure of a vapor of selected material when introduced into said chamber so as to form an adsorbed layer upon said substrate surface, directing a light pattern of said second predetermined wavelength onto said substrate surface and in a predetermined geometric pattern to react portions of said adsorbed layer thus formed, and evacuating said chamber to remove said vapor of selected material and desorb portions of said adsorbed layer not irradiated by said light pattern of said second predetermined wavelength.

8. The method of forming thin film semiconductor circuits upon the surface of a rigid substrate positioned within a chamber comprising the steps of forming an adsorbed layer of a vapor of a compound of germanium upon said substrate surface; said vapor capable of decomposing in a photolytic reaction with light of a first predetermined wavelength when in the gas phase and with light of a second predetermined wavelength when adsorbed on said substrate surface; directing light of said second predetermined wavelength onto said adsorbed layer to preferentially react selected regions of said adsorbed layer and convert said selected regions to germanium; reducing the pressure of said vapor within said chamber to desorb and remove unreacted regions of said adsorbed layer; depositing impurity materials of selected type in contact with said selected regions; and subjecting said substrate and said selected regions to an elevated temperature to diffuse one or more of said contacting materials in and through said selected regions.

9. A method of forming a geometric pattern of material upon the surface of a rigid substrate positioned within a chamber comprising the steps of supplying at least one vapor capable of forming free radicals when photolytically reacted with light of a first predetermined wavelength; said vapors forming an adsorbed layer upon said surface of said substrate; said adsorbed layer capable of forming free radicals when photolytically reacted with light of a second predetermined wavelength; said second predetermined wavelength being longer than said first predetermined wavelength; and selectively directing light of said second predetermined wavelength onto said adsorbed layer in said geometric pattern to preferentially initiate a surface reaction thereon.

10. A method of forming a thin film in a precise geometric pattern upon a rigid substrate positioned within a chamber comprising the steps of forming a thin film coating of a chemically etchable material upon said substrate within said chamber; introducing a photopolymerizable monomer gas into said chamber to form an adsorbed layer upon said film of etchable material; said monomer gas capable of being photolytically reacted in the gas phase by light of a first predetermined wavelength and when adsorbed upon said film of etchable material by light of a second predetermined wavelength; selectively directing light in said geometric pattern and of said second predetermined wavelength to react said adsorbed layer and to convert selected portions of said adsorbed layer to a thin polymeric film; and chemically etching said film of etchable material to preferentially remove portions of said film of etchable material not coated by said polymeric film.

11. A method of depositing a precise geometric pattern of a material onto a rigid substrate comprising the steps of positioning said substrate in a gaseous conduit system, continuously directing an inert atmosphere along said conduit system, introducing into said conduit system an organic vapor at a controlled pressure and capable of forming a chemisorbed layer over the surface of said substrate, said organic vapor capable being photolytically reacted in the gas phase by light of a first predetermined wavelength and when chemisorbed of said substrate surface by light of a second predetermined wavelength, photolytically treating so as to react only selected portions of said chemisorbed layer thus formed by light of said second predetermined wavelength in accordance with said precise geometric pattern, and reducing the partial pressure of said organic vapor in said conduit system so as to remove unreacted portions of said adsorbed layer by desorption.

12. A method of forming a multilayer thin film circuit on a rigid substrate comprising the step of positioning said substrate in an inert medium, introducing partial pressures of organic vapors in selected sequence and at a controlled partial pressure into said medium so as to form chemisorbed layers of said organic vapors in turn over said substrate, each of said organic vapors capable of being photolytically reacted in the gas phase by light of a first predetermined wavelength and when chemisorbed on said substrate by light of a second predetermined wavelength, and photolytically treating so as to react only selected portions of each of said chemisorbed layers with light of said second predetermined wavelength, and sufficiently delaying the introduction of a next organic vapor in said sequence so as to remove unreacted portions of a previously-formed chemisorbed layer by desorption.

13. A method of forming a thin polymer film onto a rigid substrate comprising the steps of positioning said substrate in a conduit system along which an inert medium is continuously flowing, introducing a vapor of an organic material into said conduit system at a controlled partial pressure so as to form a chemisorbed layer over the surface of said substrate, said organic material capable of being photolytically treated in the gas phase by light of a first predetermined wavelength and when chemisorbed over the surface of said substrate by light of a second predetermined wavelength, said organic material when photolytically treated, forms free radicals reactive one with the other so as to form said polymer film, and photolytically treating said chemisorbed layer with light of said second predetermined wavelength to form said free radicals.

References Cited by the Examiner

UNITED STATES PATENTS

| | | | |
|---|---|---|---|
| 2,386,448 | 10/1945 | Dreisbach | 204—162 |
| 2,450,099 | 9/1948 | Thompson | 204—162 |
| 2,480,751 | 8/1949 | Marks. | |
| 2,746,420 | 5/1956 | Steigerwald | 118—8 |
| 2,771,055 | 11/1956 | Kelly et al. | 118—49 |
| 2,816,523 | 12/1957 | Johnson | 118—8 |
| 2,841,477 | 7/1958 | Hall | 204—157 |
| 2,929,710 | 3/1960 | Martin. | |
| 2,960,417 | 11/1960 | Strother | 117—217 |
| 3,023,727 | 3/1962 | Theodoseau et al. | 117—217 |
| 3,024,180 | 3/1962 | McGraw. | |
| 3,113,889 | 12/1963 | Cooper et al. | 117—217 |
| 3,113,896 | 12/1963 | Mann | 117—5.5 |
| 3,117,022 | 1/1964 | Bronson et al. | 117—212 |
| 3,119,707 | 1/1964 | Christy | 117—71 |
| 3,132,046 | 5/1964 | Mann | 117—217 |
| 3,159,603 | 12/1964 | Sporer et al. | 96—115 |
| 3,168,404 | 2/1965 | McGraw | 96—115 |
| 3,201,237 | 8/1965 | Cerwonka | 204—158 |

FOREIGN PATENTS

| | | |
|---|---|---|
| 233,173 | 6/1959 | Australia. |
| 717,708 | 11/1954 | Great Britain. |
| 867,959 | 5/1961 | Great Britain. |

ALFRED L. LEAVITT, *Primary Examiner.*

RICHARD D. NEVIUS, *Examiner.*

A. H. ROSENSTEIN, *Assistant Examiner.*